(12) United States Patent
Lin et al.

(10) Patent No.: US 10,581,465 B2
(45) Date of Patent: Mar. 3, 2020

(54) SPECIAL NODE (CONSTITUENT CODE) PROCESSING FOR FAST/SIMPLIFIED POLAR SUCCESSIVE CANCELLATION LIST (SCL) DECODER

(71) Applicant: Samsung Electronics Co., Ltd., Gyeonggi-do (KR)

(72) Inventors: Hsien-Ping Lin, San Diego, CA (US); Jung Hyun Bae, San Diego, CA (US)

(73) Assignee: Samsung Electronics Co., Ltd (KR)

(*) Notice: Subject to any disclaimer, the term of this patent is extended or adjusted under 35 U.S.C. 154(b) by 53 days.

(21) Appl. No.: 15/949,770

(22) Filed: Apr. 10, 2018

(65) Prior Publication Data

US 2019/0215018 A1 Jul. 11, 2019

Related U.S. Application Data

(60) Provisional application No. 62/616,165, filed on Jan. 11, 2018.

(51) Int. Cl.
  *H03M 13/45* (2006.01)
  *H03M 13/15* (2006.01)

(52) U.S. Cl.
  CPC ..... *H03M 13/458* (2013.01); *H03M 13/1575* (2013.01)

(58) Field of Classification Search
  CPC .................. H03M 13/458; H03M 13/1575
  See application file for complete search history.

(56) References Cited

U.S. PATENT DOCUMENTS 9,742,440 B2 * 8/2017 El-Khamy ........ H03M 13/6368
2016/0056843 A1 * 2/2016 Gross ...................... G06F 17/10
714/781

(Continued)

FOREIGN PATENT DOCUMENTS

CN 105281785 10/2015

OTHER PUBLICATIONS

S. A. Hashemi, C. Condo, and W. J. Gross, "Fast Simplified Successive-Cancellation List Decoding of Polar Codes," in IEEE Wireless Commun. and Netw. Conf., San Francisco, USA, Jan. 27, 2017.

(Continued)

*Primary Examiner* — Thien Nguyen

(74) *Attorney, Agent, or Firm* — The Farrell Law Firm, P.C.

(57) ABSTRACT

An apparatus for constituent code processing in polar successive cancellation list (SCL) decoding and a method thereof. The apparatus includes a processor configured to determine an activation value I and a number r of the candidate paths, where I is a binary value and r is an integer, $(I, r) = f(R, k, m)$, $f$ is a function, R is a number indicating node reliability, k is an integer indicating a number of information nodes, and m is an integer indicating a number of leaf nodes; determine $min_1, min_2, \ldots, min_q$, wherein q is a number of least reliable bits; determine r candidate paths; determine path metrics $PM_{t_j}$ of a codeword j for each candidate path t; and select r most probable paths based on $PM_{t_j}$.

20 Claims, 7 Drawing Sheets

(56) References Cited

U.S. PATENT DOCUMENTS

2018/0287640 A1* 10/2018 Lin ................... H03M 13/3746
2019/0165818 A1* 5/2019 Miyazaki .......... H03M 13/3961

OTHER PUBLICATIONS

Bo Yuan, Keshab K. Parhi, "LLR-based Successive-Cancellation List Decoder for Polar Codes with Multi-bit Decision", Jun. 19, 2015.
G. Sarkis, P. Giard, A. Vardy, C. Thibeault, and W. J. Gross, "Fast List Decoders for Polar Codes," IEEE J. Sel. Areas Commun., vol. 34, No. 2, pp. 318-328, Feb. 2016.
J. Lin, C. Xiong, and Z. Yan, "A High throughput list decoder architecture for Polar codes," IEEE Trans. VLSI systems, vol. 24, Issue 6, pp. 2378-2391, Jun. 2016.

* cited by examiner

US 10,581,465 B2

SPECIAL NODE (CONSTITUENT CODE) PROCESSING FOR FAST/SIMPLIFIED POLAR SUCCESSIVE CANCELLATION LIST (SCL) DECODER

PRIORITY

This application claims priority under 35 U.S.C. § 119(e) to a U.S. Provisional Patent Application filed on Jan. 11, 2018 in the United States Patent and Trademark Office and assigned Ser. No. 62/616,165, the entire contents of which are incorporated herein by reference.

FIELD

The present disclosure relates generally to communication systems, and more particularly, to an apparatus and a method of special node (constituent code) processing for a fast/simplified polar successive cancellation list (SCL) decoder.

BACKGROUND

Due to a serial decoding feature of conventional successive cancellation (SC) and SCL decoding methods, long latency of a polar code decoder limits the practical applications of a polar code. To improve decoding latency, simplified successive cancellation list (SSCL) decoding applies appropriate candidate path splitting and path metric updating on certain types of intermediate nodes that correspond to a smaller constituent polar code structure called special nodes without deploying the explicit SCL decoding.

Examples of particular constituent codes that have been explored include Rate-0 code, which corresponds to a constituent code having no information bits; Rate-1 code, which corresponds to a constituent code having only information bits; Rate-R code, which corresponds to a constituent repetition code; and Rate-S code, which corresponds to a single parity check code.

In typical SSCL methods, there is no well-established logic in determining the amount of path splitting in special nodes. In addition, there is no further differentiation within each special node type in terms of processing, which fails to capture their different polarization features in polar decoding.

In general, there is a tradeoff in processing constituent codes between achieved latency reduction/hardware complexity and potential performance degradation. Therefore, operating with the best possible tradeoff, i.e., operating with best performance with given latency reduction/hardware complexity, is an important target in a decoder design.

SUMMARY

According to one embodiment, an apparatus for constituent code processing in polar successive cancellation list (SCL) decoding is provided. The apparatus includes a processor configured to: determine an activation value I and a number r of the candidate paths, where I is a binary value and r is an integer, $(I, r) = f(R, k, m)$, $f$ is a function, R is a number indicating node reliability, k is an integer indicating a number of information nodes, and m is an integer indicating a number of leaf nodes; determine $\min_1, \min_2, \ldots, \min_q$, wherein q is a number of least reliable bits; determine r candidate paths; determine path metrics $PM_{t_j}$ of a codeword j for each candidate path t; and select r most probable paths based on $PM_{t_j}$.

According to one embodiment, a method of constituent code processing for polar successive cancellation list (SCL) decoder is provided. The method includes determining an activation value I and a number r of the candidate paths, where I is a binary value and r is an integer, $(I, r) = f(R, k, m)$, $f$ is a function, R is a number indicating node reliability, k is an integer indicating a number of information nodes, and m is an integer indicating a number of leaf nodes; determining $\min_1, \min_2, \ldots, \min_q$, wherein q is a number of least reliable bits; determining r candidate paths; determining path metrics $PM_{t_j}$ of a codeword j for each candidate path t; and selecting r most probable paths based on $PM_{t_j}$.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
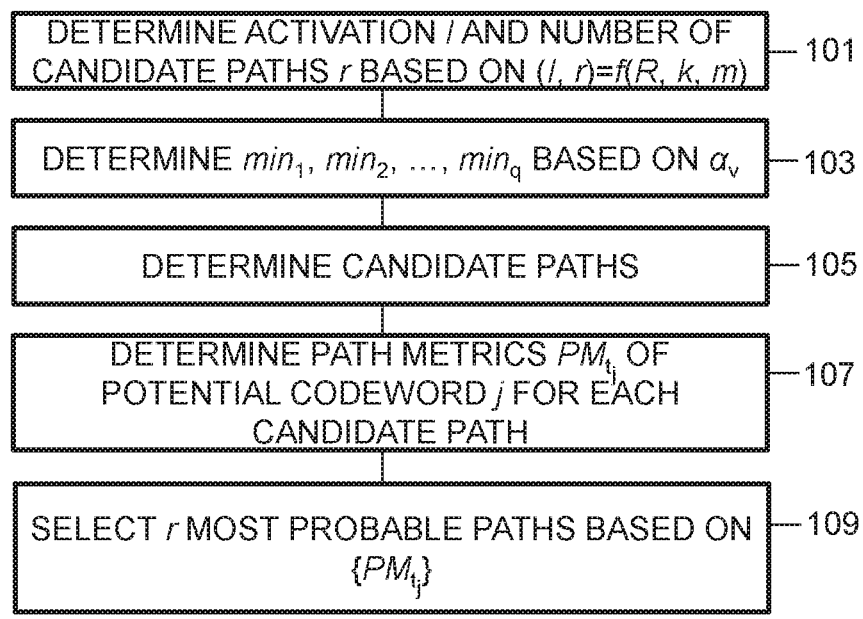
FIG. 1 is a flowchart for selecting candidate paths, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The present disclosure concerns an apparatus and a method of special node (constituent code) processing for a fast/simplified polar SCL decoder.

In typical SSCL methods, there is no explicit consideration of generating candidate paths with the highest reliabilities when applying path splitting.

FIG. 1 is a flowchart for selecting candidate paths, according to an embodiment.

Referring to FIG. 1, at 101, the present system determines an activation I and a number r of candidate paths (e.g., in a first processor) as $(I, r)=f(R, k, m)$, where I is a binary value, r is an integer, $f$ is a function, R is a number indicating node reliability, k is an integer indicating a number of information nodes, m is an integer indicating a number of leaf nodes. In addition, $path_s$ is a current path and $\alpha_v$ is a vector of length m that indicates LLRs of node v.

For example, if an SPC node is k=m−1 and I=1 for all SPC nodes, $f(R, k=m-1, m)=(I, r)=(1, 4)$ if $v \in R_g$, and $f(R, k=m-1, m)=(I, r)=(0, 0)$ otherwise, where $R_g$ is a region of a second half of a polar code tree, and where reliability R is characterized by node location.

At 103, the present system determines $\min_1, \min_2, \ldots, \min_q$ (e.g., in a second processor) based on $\alpha_v$, where q is a number of least reliable bits in $h(\alpha_v[i])$, $\{\min_j\}$ are indices of the q least reliable bits with relation $\alpha_v[\min_1] \leq \alpha_v[\min_2] \leq \ldots \leq \alpha_v[\min_q]$, and i and j are integers.

For example, if an SPC node is k=m−1, I=1, r=4 for any R and m, and $f(R, m-1, m)=(1, 4)$, and q=4, four minimum elements are found in $|\alpha_v|$, where $\alpha_v$ is a vector of length m that indicates an incoming LLR for node v. In general, the smallest q may be found for an r, k, and m.

At 105, the present system determines candidate paths r (e.g., in a third processor).

At 107, the present system determines path metrics $PM_{t_j}$ of potential codeword j for each candidate path (e.g., in a fourth processor).

For example, a path metric $PM_t$ of the candidate path t is generated as $PM_t = PM_s - \Sigma_i |\beta_t[i] - h(\alpha_v[i])| \times |\alpha_v[i]|$, where $PM_s$ is an incoming path metric, $\beta_t$ is a candidate codeword of node v, $h(\alpha_v[i])$ is hard decision of $\alpha_v[i]$, and $PM_t$ is the reliability of candidate path t. $\beta_t$ may satisfy $\oplus_i \beta_t[i]=0$ in SPC node. The most likely (ML) candidate (subject to $\oplus_i \beta_t[i]=0$) is $\beta_t[i]=h(\alpha_v[i])$ with $PM_t=PM_s$. $PM_t$ of other candidates may be generated by using q=4 minimum elements in $|\alpha_v|$.

At 109, the present system selects r of the most probable paths based on $\{PM_{t_j}\}$ (e.g., in a fifth processor).

For example, four (e.g., r=4) most probable paths may be found as $PM_{t,1}, PM_{t,2}, PM_{t,3}$, and $\max(PM_{t,4}, PM_{t,5})$, where $PM_{t,1} \geq PM_{t,2} \geq PM_{t,3} \geq PM_{t,4}$, $PM_{t,5}$, $PM_{t_1}=PM_s-(1-p)|\alpha_v[\min_1]|$ (flips the least reliable bit of $h(\alpha_v[i])$ when p=0), $PM_{t_2}=PM_s-p|\alpha_v[\min_1]|-|\alpha_v[\min_2]|$ (flips the least 2 reliable bits of $h(\alpha_v[i])$ depending on p), $PM_{t_3}=PM_s-p|\alpha_v[\min_1]|-|\alpha_v[\min_3]|$ (flips 2 of unreliable bits of $h(\alpha_v[i])$ depending on p), $PM_{t_4}=PM_s-p|\alpha_v[\min_1]|-|\alpha_v[\min_4]|$ (flips 2 of unreliable bits of $h(\alpha_v[i])$ depending on p), $PM_{t_5}=PM_s-(1-p)|\alpha_v[\min_1]|-|\alpha_v[\min_2]|-|\alpha_v[\min_3]|$ (flips the least 3 reliable bits of $h(\alpha_v[i])$ depending on p), and $p=1-\oplus_i h(\alpha_v[i])$ reflects the structure constraint of SPC node.

The present system and method may be applied to special nodes having simplified processing, as well as any general type of constituent codes with arbitrary size m having k information leaf nodes, $0 \leq k \leq m$, by using the systematic candidate paths pruning process as described above with reference to FIG. 1.

For example, a single parity check (SPC) node may be processed that has all leaf nodes as information bits except the first one. An SPC node is an example of a typical special node. In a case where r is 4, and a path metric is $PM_t=PM_s-\Sigma_i|\beta_t[i]-h(\alpha_v[i])| \times |\alpha_v[i]|$, it suffices to consider four least reliable bits (i.e., q=4), and the following five potential candidates in Equations (1)-(5) as follows:

$$PM_{t_1}=PM_s-(1-p)|\alpha_v[\min_1]| \text{ (flips the least reliable bit of } h(\alpha_v[i]) \text{ when } p=0\text{),} \quad (1)$$

$$PM_{t_2}=PM_s-p|\alpha_v[\min_1]|-|\alpha_v[\min_2]| \text{ (flips the least 2 reliable bits of } h(\alpha_v[i]) \text{ depending on } p\text{),} \quad (2)$$

$$PM_{t_3}=PM_s-p|\alpha_v[\min_1]|-|\alpha_v[\min_3]| \text{ (flips 2 of unreliable bits of } h(\alpha_v[i]) \text{ depending on } p\text{),} \quad (3)$$

$$PM_{t_4}=PM_s-p|\alpha_v[\min_1]|-|\alpha_v[\min_4]| \text{ (flips 2 of unreliable bits of } h(\alpha_v[i]) \text{ depending on } p\text{),} \quad (4)$$

$$PM_{t_5}=PM_s-(1-p)|\alpha_v[\min_1]|-|\alpha_v[\min_2]|-|\alpha_v[\min_3]| \text{ (flips the least 3 reliable bits of } h(\alpha_v[i]) \text{ depending on } p\text{),} \quad (5)$$

where $p=1-\oplus_i h(\alpha_v[i])$.

In this case, $PM_{t,1} \geq PM_{t,2} \geq PM_{t,3} \geq PM_{t,4}, PM_{t,5}$, so the four most probable candidate paths have path metrics $PM_{t,1}, PM_{t,2}, PM_{t,3}$, and $\max(PM_{t,4}, PM_{t,5})$. The present system determining the r most reliable candidate paths may be conducted in a fairly efficient manner in most practical situations by appropriately considering flipping certain combinations of q least reliable bits in $h(\alpha_v[i])$.

According to an embodiment, the function $f(R, k, m)=(I, r)$ may be a constant function for an SPC node, i.e., all the SPC nodes in the decoding tree structure are processed by considering a fixed number r of candidate paths. A more general form of $f$ can provide a better tradeoff between latency reduction/hardware complexity and potential performance degradation. A generalization may be considered that provides a location-based determination of I. For example, (I, r)=(1, 4) if v∈$R_g$, (I, r)=(0, 0), otherwise, for an SPC node v. Thus, reliability R is being determined by the location of a node.

Figure 2:
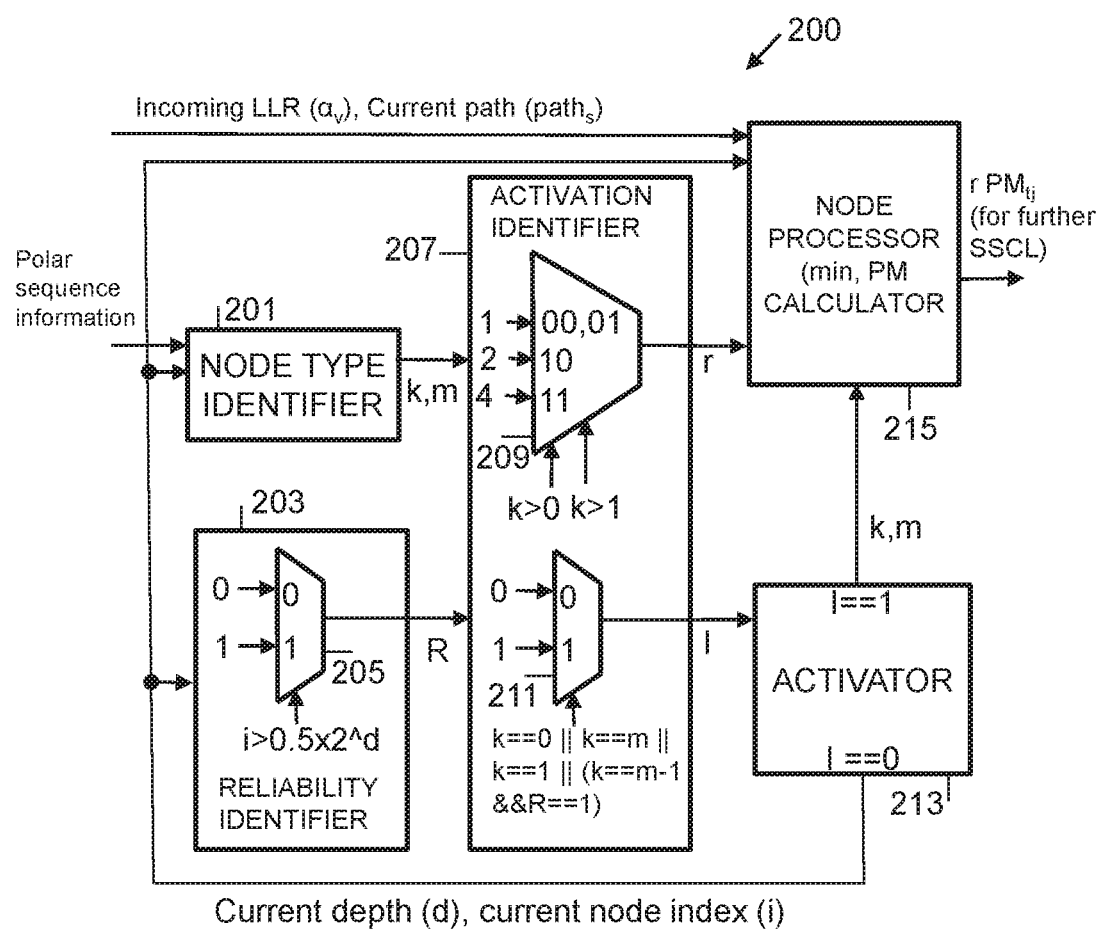
FIG. 2 is a block diagram of an apparatus for selecting candidate paths, according to an embodiment.

FIG. 2 is a block diagram of an apparatus 200 for selecting candidate paths, according to an embodiment.

Referring to FIG. 2, the apparatus 200 includes a node type identifier 201, a reliability identifier 203, an activation identifier 207, an activator 213, and a node processor 215.

The node type identifier 201 includes a first input for receiving polar sequence information, a second input for receiving current depth (d) and current node index (i), and an output for providing integers k and m, where k indicates a number of information nodes, and m indicates a number of leaf nodes.

The reliability identifier 203 includes an input for receiving d and i, and an output for providing an integer R, which indicates node reliability. The reliability identifier 203 includes multiplexer 205 that includes a first input for receiving an integer 0, a second input for receiving an integer 1, and a third control input for receiving i and multiplexing between 0 and 1 to provide R based on determining whether i is greater than $0.5 \times 2^d$ or not.

The activation identifier 207 includes a first input connected to the output of the node type identifier 201 for receiving k and m, a second input connected to the output of the reliability identifier 203 to receive R, a first output for providing r, and a second output for providing I, where r indicates a number of candidate codewords, and where I indicates either that the activator 213 should be activated or i or d should be incremented. The activation identifier 207 includes a first multiplexer 209 and a second multiplexer 211. The first multiplexer 209 includes a first input for receiving a value 1, a second input for receiving a value 2, a third input for receiving a value 4, a first control input for receiving k and determining if k is greater than 0, a second control input for receiving k and determining if k is greater than 1, and an output for providing r. The second multiplexer 211 includes a first input for receiving a value 0, a second input for receiving a value 1, a control input for receiving k and R and determining if k is equal to 0, k is equal to m, k is equal to 1, or k is equal to m−1 or R is equal to 1; and an output for providing I, where I has a value of 0 or 1.

The activator 213 includes an input connected to the second output of the activation identifier 207 for receiving I, a first output for incrementing i if i is less than $2^d$ or incrementing d otherwise when I is equal to 0, and a second output for providing k and m when I is equal to 1. The activation identifier 207 and the activator 213 perform step 101 of FIG. 1.

The node processor 215 includes a first input for receiving an incoming log-likelihood ratio (RRL) $\alpha_v$ and a current path $path_s$, a second input for receiving d and i, a third input connected to the output of the activation identifier 207 for receiving r, a fourth input connected to the second output of the activator 213 for receiving k and m, and an output for providing an r number of $PM_{t_j}$ for further SSCL. The node processor 215 performs steps 103, 105, 107, and 109 of FIG. 1.

Figure 3:
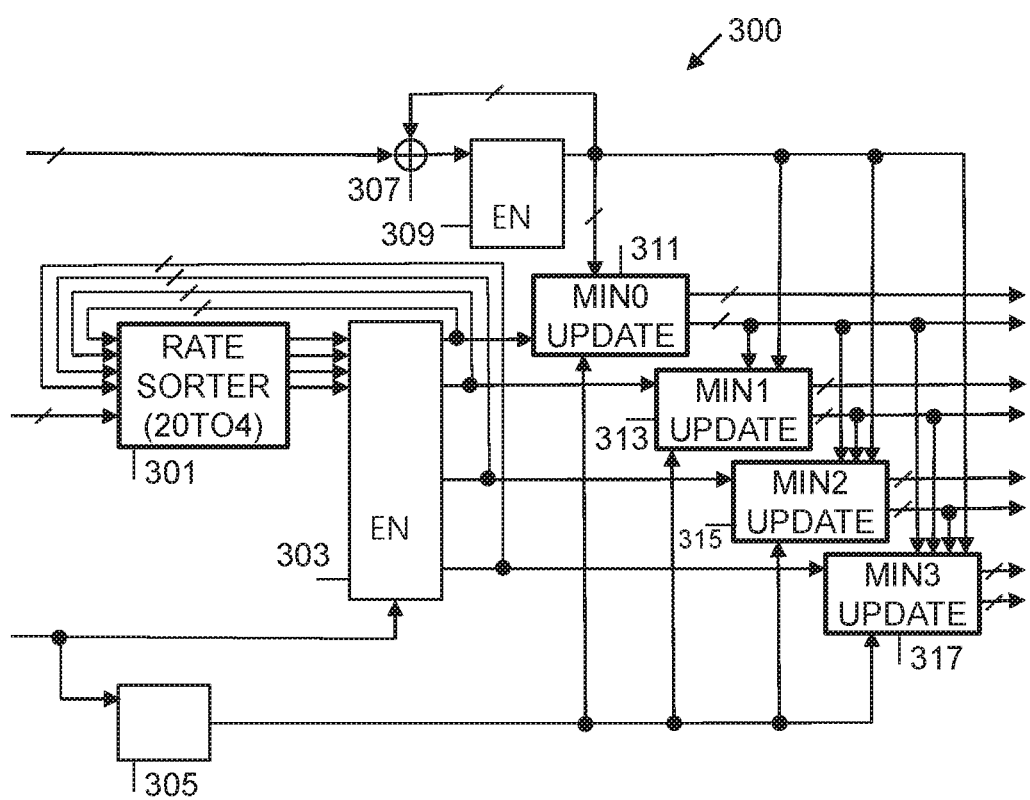
FIG. 3 is a block diagram of an apparatus for determining single parity check (SPC) code minimum index and absolute value searcher, according to an embodiment.

FIG. 3 is a block diagram of an apparatus 300 for determining SPC-code minimum index and an absolute value (abs) searcher, according to an embodiment.

According to one embodiment, the apparatus 300 performs step 103 of FIG. 1, where q is 4. In an embodiment, the activation indicator I is 1 while r is 4 in step 101 of FIG. 1. That is, (I=1, r=4)=ƒ(R, k, m) for any R and k while k=m−1 for an SPC node. FIG. 3 may also have $min_0$, $min_1$, $min_2$, $min_3$ updaters as well as a rate sorter as a component block.

The apparatus 300 includes a rate sorter 301, a flip-flop 303, a flip-flop 305, a flip-flop 309, an adder 307, a $min_0$ updater 311, a $min_1$ updater 313, a $min_2$ updater 315, and a $min_3$ updater 317. Rate sorter 301 determines the 4 minimum absolute LLRs and the associated indices from 20 input LLRs. Function block 309 accumulates the number of LLRs which have been sorted. $min_0$ updater 311, $min_1$ updater 313, $min_2$ updater 315, and $min_3$ updater 317 are used to store the 4 minimum absolute LLRs from rate sorter 301 and calculate the associated indices from rate sorter 301 and function block 309.

Figure 4:
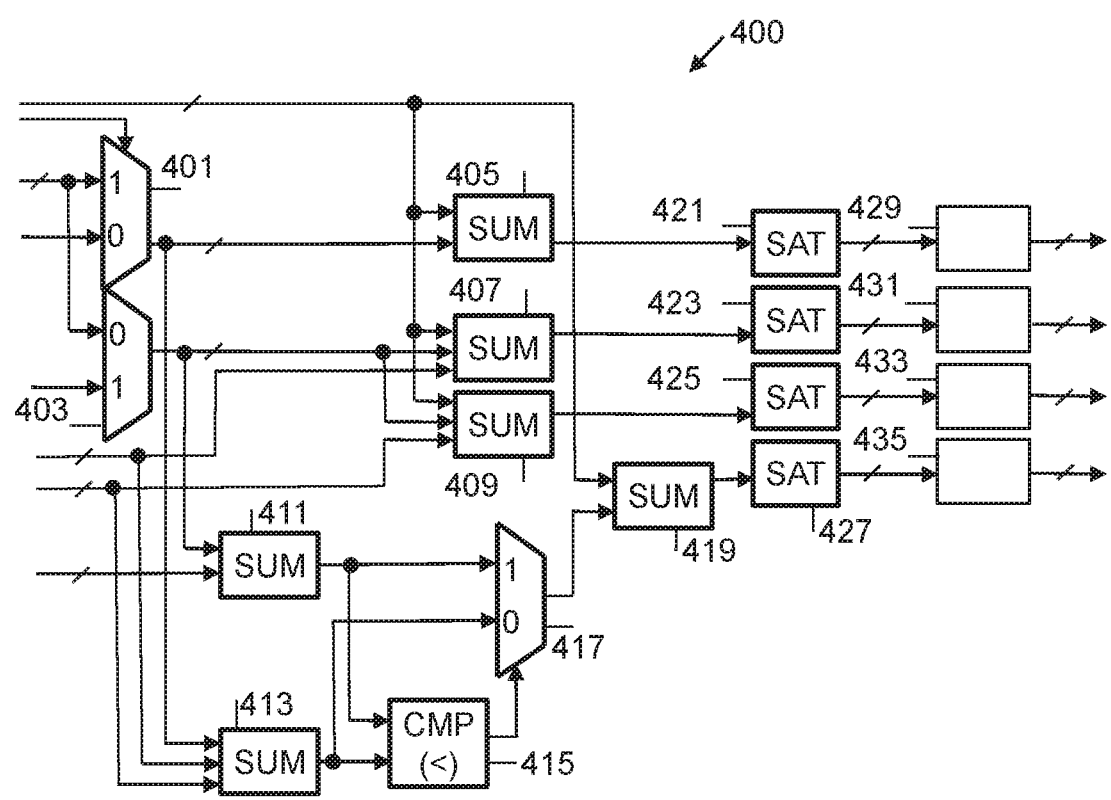
FIG. 4 is a block diagram of an apparatus for determining an SPC-node path metric (PM), according to an embodiment.

FIG. 4 is a block diagram of an apparatus 400 for determining SPC-node PM, according to an embodiment.

According to one embodiment, the apparatus 400 performs steps 107 and 109 of FIG. 1, where r is 4.

The apparatus 400 includes a first multiplexer 401, a second multiplexer 403, a first sum block 405, a second sum block 407, a third sum block 409, a fourth sum block 411, a fifth sum block 413, a comparator 415, a third multiplexer 417, a sixth sum block 419, a first satisfaction (sat) block 421, a second sat block 423, a third sat block 425, a fourth sat block 427, a flip-flop 429, a flip-flop 431, a flip-flop 433, and a flip-flop 435. Multiplexer 401 and multiplexer 403 determine $(1-p)|\alpha_v[min_1]|$ and $p|\alpha_v[min_1]|$, respectively. Sum block 405, sum block 407, and sum block 409 are used to calculate $PM_{t_1}=PM_s-(1-p)|\alpha_v[min_1]|$, $PM_{t_2}=PM_s-p|\alpha_v[min_1]|-|\alpha_v[min_2]|$, and $PM_{t_3}=PM_s-p|\alpha_v[min_1]|-|\alpha_v[min_3]|$, respectively. Comparator 415 and multiplexer 417 select minimum from either sum block 411 which calculates $p|\alpha_v[min_1]|-|\alpha_v[min_4]|$ or sum block 413 which calculates $(1-p)|\alpha_v[min_1]|-|\alpha_v[min_2]|-|\alpha_v[min_3]|$. Sum block 419 calculates $PM_s-min((1-p)|\alpha_v[min_1]|-|\alpha_v[min_2]|-|\alpha_v[min_3]|, p|\alpha_v[min_1]|-|\alpha_v[min_4]|)$.

According to an embodiment, the present system and method provides processing of constituent codes from SSCL decoding of polar codes, including determining an activation indicator I and a number of candidate paths r for processing a constituent code based on reliability R, a number of information nodes k, and a number of leaf nodes m of a constituent code, where the activation indicator I indicates whether the constituent code may be decoded without traversing a sub-tree. The present system and method further determines candidate path metrics of potential codewords of the number of candidate paths by flipping combinations of least reliable bits that satisfy constraints imposed by the constituent code, and determines a number of most probable candidate paths among potential codewords.

Figure 5:
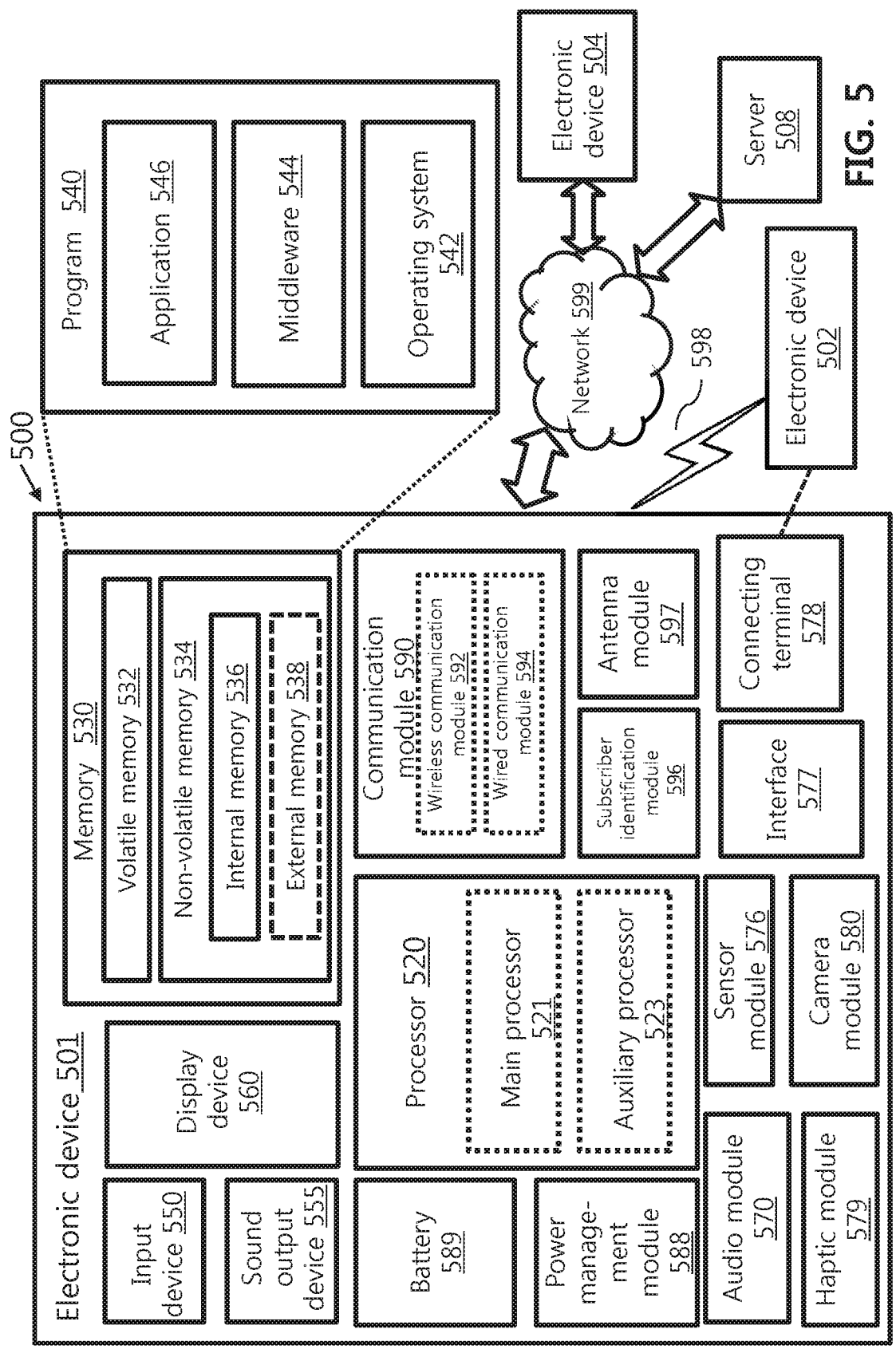
FIG. 5 is a block diagram of an electronic device in a network environment, according to an embodiment.

FIG. 5 is a block diagram of an electronic device 501 in a network environment 500, according to an embodiment.

Referring to FIG. 5, the electronic device 501 in the network environment 500 may communicate with an electronic device 502 via a first network 598 (e.g., a short-range wireless communication network), or an electronic device 504 or a server 508 via a second network 599 (e.g., a long-range wireless communication network). According to an embodiment, the electronic device 501 may communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597. In an embodiment, at least one (e.g., the display device 560 or the camera module 580) of the components may be omitted from the electronic device 501, or one or more other components may be added to the electronic device 501. In an embodiment, some of the components may be implemented as a single integrated circuit (IC). For example, the sensor module 576 (e.g., a fingerprint sensor, an iris sensor, or an illuminance sensor) may be embedded in the display device 560 (e.g., a display).

The processor 520 may execute, for example, software (e.g., a program 540) to control at least one other component (e.g., a hardware or a software component) of the electronic device 501 coupled with the processor 520, and may perform various data processing or computations. According to one embodiment, as at least part of the data processing or computations, the processor 520 may load a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or execute a particular function. The auxiliary processor 523 may be implemented as being separate from, or a part of, the main processor 521.

The auxiliary processor 523 may control at least some of the functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an image signal processor or a communication processor) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by other component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. According to an embodiment, the receiver may be implemented as being separate from, or a part of, the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. According to an embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to an embodiment, the audio module 570 may obtain the sound via the input device 550, or output the sound via the sound output device 555 or a headphone of an external electronic device (e.g., electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device (e.g., the electronic device 502). According to an embodiment, the connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or an electrical stimulus which may be recognized by a user via tactile sensation or kinesthetic sensation. According to an embodiment, the haptic module 579 may include, for example, a motor, a piezoelectric element, or an electrical stimulator.

The camera module 580 may capture a still image or moving images. According to an embodiment, the camera module 580 may include one or more lenses, image sensors, image signal processors, or flashes.

The power management module 588 may manage power supplied to the electronic device 501. According to one embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the AP) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or a standard of the Infrared Data Association (IrDA)) or the second network 599 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. According to an embodiment, the antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to an embodiment, commands or data may be transmitted or received between the electronic device 501 and the external electronic device 504 via the server 508 coupled with the second network 599. Each of the electronic devices 502 and 504 may be a device of a same type as, or a different type, from the electronic device 501. According to an embodiment, all or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

The electronic device according to an embodiment may be one of various types of electronic devices. The electronic devices may include, for example, a portable communication device (e.g., a smart phone), a computer, a portable multimedia device, a portable medical device, a camera, a wearable device, or a home appliance. According to an embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to an embodiment, a module may be implemented in a form of an application-specific integrated circuit (ASIC).

An embodiment may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities. According to an embodiment, one or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 6:
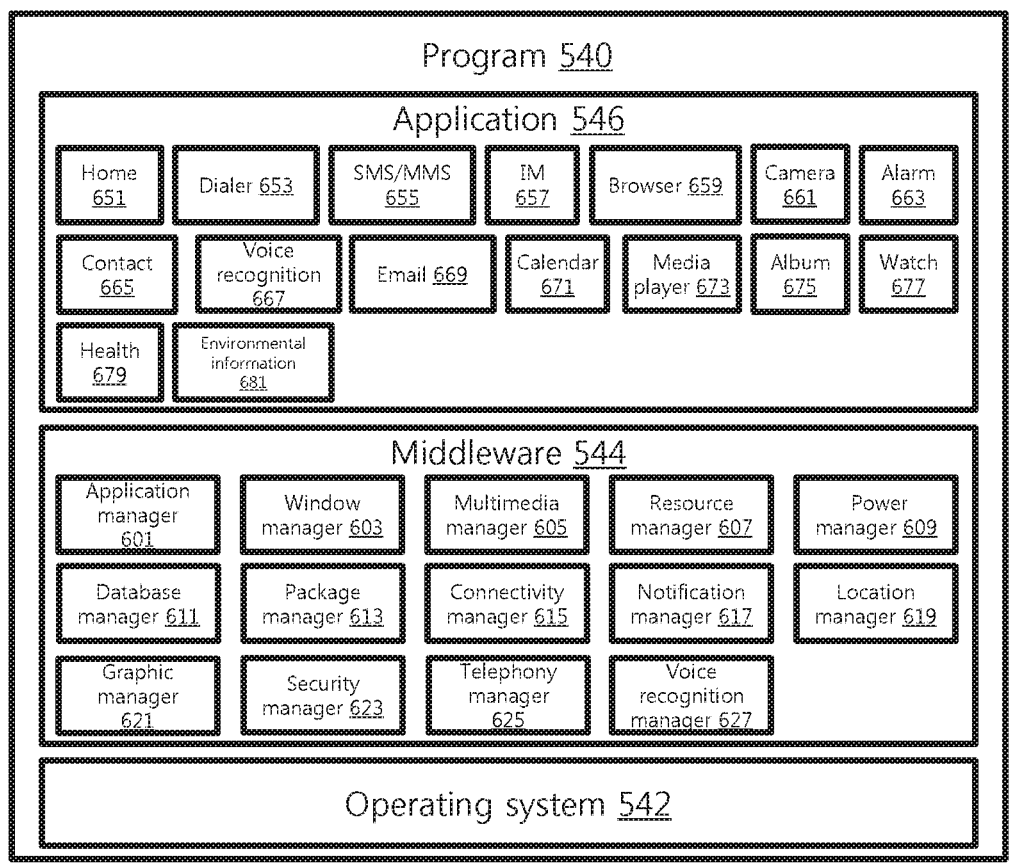
FIG. 6 is a block diagram of a program, according to one embodiment.

FIG. 6 is a block diagram of the program 540 according to an embodiment.

Referring to FIG. 6, the program 540 may include an OS 542 to control one or more resources of the electronic device 501, middleware 544, or an application 546 executable in the OS 542. The OS 542 may include, for example, Android®, iOS®, Windows®, Symbian®, Tizen®, or Bada™. At least part of the program 540, for example, may be pre-loaded on the electronic device 501 during manufacture, or may be downloaded from or updated by an external electronic device (e.g., the electronic device 502 or 504, or the server 508) during use by a user.

The OS 542 may control management (e.g., allocating or deallocation) of one or more system resources (e.g., process, memory, or power source) of the electronic device 501. The OS 542, additionally or alternatively, may include one or more driver programs to drive other hardware devices of the electronic device 501, for example, the input device 550, the sound output device 555, the display device 560, the audio module 570, the sensor module 576, the interface 577, the haptic module 579, the camera module 580, the power management module 588, the battery 589, the communication module 590, the subscriber identification module 596, or the antenna module 597.

The middleware 544 may provide various functions to the application 546 such that a function or information provided from one or more resources of the electronic device 501 may be used by the application 546. The middleware 544 may include, for example, an application manager 601, a window manager 603, a multimedia manager 605, a resource manager 607, a power manager 609, a database manager 611, a package manager 613, a connectivity manager 615, a notification manager 617, a location manager 619, a graphic manager 621, a security manager 623, a telephony manager 625, or a voice recognition manager 627.

The application manager 601, for example, may manage the life cycle of the application 546. The window manager 603, for example, may manage one or more graphical user interface (GUI) resources that are used on a screen. The multimedia manager 605, for example, may identify one or more formats to be used to play media files, and may encode or decode a corresponding one of the media files using a codec appropriate for a corresponding format selected from the one or more formats. The resource manager 607, for example, may manage the source code of the application 546 or a memory space of the memory 530. The power manager 609, for example, may manage the capacity, temperature, or power of the battery 589, and determine or provide related information to be used for the operation of the electronic device 501 based at least in part on corresponding information of the capacity, temperature, or power of the battery 589. According to an embodiment, the power manager 609 may interoperate with a basic input/output system (BIOS) of the electronic device 501.

The database manager 611, for example, may generate, search, or change a database to be used by the application 546. The package manager 613, for example, may manage installation or update of an application that is distributed in the form of a package file. The connectivity manager 615, for example, may manage a wireless connection or a direct connection between the electronic device 501 and the external electronic device. The notification manager 617, for example, may provide a function to notify a user of an occurrence of a specified event (e.g., an incoming call, message, or alert). The location manager 619, for example, may manage locational information on the electronic device 501. The graphic manager 621, for example, may manage one or more graphic effects to be offered to a user or a user interface related to the one or more graphic effects.

The security manager 623, for example, may provide system security or user authentication. The telephony manager 625, for example, may manage a voice call function or a video call function provided by the electronic device 501. The voice recognition manager 627, for example, may transmit a user's voice data to the server 508, and receive, from the server 508, a command corresponding to a function to be executed on the electronic device 501 based at least in part on the voice data, or text data converted based at least in part on the voice data. According to an embodiment, the middleware 544 may dynamically delete some existing components or add new components. According to an embodiment, at least part of the middleware 544 may be included as part of the OS 542 or may be implemented in other software separate from the OS 542.

The application 546 may include, for example, a home application 651, a dialer application 653, a short message service (SMS)/multimedia messaging service (MMS) application 655, an instant message (IM) application 657, a browser application 659, a camera application 661, an alarm application 663, a contact application 665, a voice recognition application 667, an email application 669, a calendar application 671, a media player application 673, an album application 675, a watch application 677, a health application 679 (e.g., for measuring the degree of workout or biometric information, such as blood sugar), or an environmental information application 681 (e.g., for measuring air pressure, humidity, or temperature information). According to an embodiment, the application 546 may further include an information exchanging application that is capable of supporting information exchange between the electronic device 501 and the external electronic device. The information exchange application, for example, may include a notification relay application adapted to transfer designated information (e.g., a call, a message, or an alert) to the external electronic device or a device management application adapted to manage the external electronic device. The notification relay application may transfer notification information corresponding to an occurrence of a specified event (e.g., receipt of an email) at another application (e.g., the email application 669) of the electronic device 501 to the external electronic device. Additionally or alternatively, the notification relay application may receive notification information from the external electronic device and provide the notification information to a user of the electronic device 501.

The device management application may control the power (e.g., turn-on or turn-off) or the function (e.g., adjustment of brightness, resolution, or focus) of the external electronic device or some component thereof (e.g., a display device or a camera module of the external electronic device). The device management application, additionally or alternatively, may support installation, delete, or update of an application running on the external electronic device.

Figure 7:
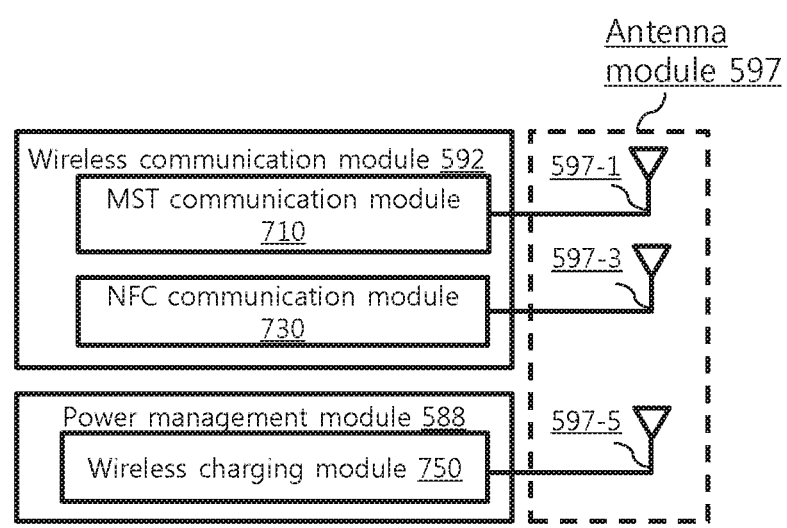
FIG. 7 is a block diagram of a wireless communication module, a power management module, and an antenna module of an electronic device, according to an embodiment.

FIG. 7 is a block diagram of the wireless communication module 592, the power management module 588, and the antenna module 597 of the electronic device 501, according to an embodiment.

Referring to FIG. 7, the wireless communication module 592 may include a magnetic secure transmission (MST) communication module 710 or a near-field communication (NFC) module 730, and the power management module 588 may include a wireless charging module 750. In this case, the antenna module 597 may include a plurality of antennas that include an MST antenna 597-1 connected with the MST communication module 710, an NFC antenna 597-3 connected with the NFC communication module 730, and a wireless charging antenna 597-5 connected with the wireless charging module 750. Descriptions of components described above with regard to FIG. 5 are either briefly described or omitted here.

The MST communication module 710 may receive a signal containing control information or payment information such as card (e.g., credit card) information from the processor 520, generate a magnetic signal corresponding to the received signal, and then transfer the generated magnetic signal to the external electronic device 502 (e.g., a point-of-sale (POS) device) via the MST antenna 597-1. To generate the magnetic signal, according to an embodiment, the MST communication module 710 may include a switching module that includes one or more switches connected with the MST antenna 597-1, and control the switching module to change the direction of voltage or current supplied to the MST antenna 597-1 according to the received signal. The change of the direction of the voltage or current allows the direction of the magnetic signal (e.g., a magnetic field) emitted from the MST antenna 597-1 to change accordingly. If detected at the external electronic device 502, the magnetic signal with its direction changing may cause an effect (e.g., a waveform) similar to that of a magnetic field that is generated when a magnetic card corresponding to the card information associated with the received signal is swiped through a card reader of the electronic device 502. According to an embodiment, for example, payment-related information and a control signal that are received by the electronic device 502 in the form of the magnetic signal may be further transmitted to an external server 508 (e.g., a payment server) via the network 599.

The NFC communication module 730 may obtain a signal containing control information or payment information such as card information from the processor 520 and transmit the obtained signal to the external electronic device 502 via the NFC antenna 597-3. According to an embodiment, the NFC communication module 730 may receive such a signal transmitted from the external electronic device 502 via the NFC antenna 597-3.

The wireless charging module 750 may wirelessly transmit power to the external electronic device 502 (e.g., a cellular phone or wearable device) via the wireless charging antenna 597-5, or wirelessly receive power from the external electronic device 502 (e.g., a wireless charging device). The wireless charging module 750 may support one or more of various wireless charging schemes including, for example, a magnetic resonance scheme or a magnetic induction scheme.

According to an embodiment, some of the MST antenna 597-1, the NFC antenna 597-3, or the wireless charging antenna 597-5 may share at least part of their radiators. For example, the radiator of the MST antenna 597-1 may be used as the radiator of the NFC antenna 597-3 or the wireless charging antenna 597-5, or vice versa. In this case, the antenna module 597 may include a switching circuit adapted to selectively connect (e.g., close) or disconnect (e.g., open) at least part of the antennas 597-1, 597-3, and 597-5, for example, under control of the wireless communication module 592 (e.g., the MST communication module 710 or the NFC communication module 730) or the power management module (e.g., the wireless charging module 750). For example, when the electronic device 501 uses a wireless charging function, the NFC communication module 730 or the wireless charging module 750 may control the switching circuit to temporarily disconnect at least one portion of the radiators shared by the NFC antenna 597-3 and the wireless charging antenna 597-5 from the NFC antenna 597-3 and to connect the at least one portion of the radiators with the wireless charging antenna 597-5.

According to an embodiment, at least one function of the MST communication module 710, the NFC communication module 730, or the wireless charging module 750 may be controlled by an external processor (e.g., the processor 520). According to an embodiment, at least one specified function (e.g., a payment function) of the MST communication module 710 or the NFC communication module 730 may be performed in a trusted execution environment (TEE). According to an embodiment, the TEE may form an execution environment in which, for example, at least some designated area of the memory 530 is allocated to be used for performing a function (e.g., a financial transaction or personal information-related function) that requires a relatively high level of security. In this case, access to the at least some designated area of the memory 530 may be restrictively permitted, for example, according to an entity accessing thereto or an application being executed in the TEE.

The present system and method provides a special node (constituent code) processing scheme that achieves better tradeoff between latency/complexity and performance. The present system and method provides functional characterization of special node processing parameters (activation, number of candidates) with dependency on polarized reliability and node type. The present system and method further provides a systematic approach to determine r most probable codewords as candidate paths.

SC and SCL decoding on a polar code of length $N=2^n$ may be mapped into N leaf nodes binary tree traversing, where n is an integer. Each leaf node represents information or frozen bits. Each intermediate node in the binary tree corresponds to a smaller constituent polar code structure. To improve the decoding latency of SCL, SSCL applies appropriate candidate path splitting and path metric updating on certain types of nodes without traveling the corresponding tree structure under SCL. The surviving paths in the list are pruned from the candidate paths according to the path metrics.

In an embodiment, a node v has m leaf nodes, where m is an integer. Log-likelihood ratios (LLRs) of node v is $\alpha_v$, which is a vector of length m. A decoding path s with path metric $PM_s$ generates a candidate path t with path metric $PM_t$ based on a candidate codeword $\beta_t$ of node v. A path metric which depends on $\alpha_v$ and $\beta_t$ represents a likelihood of the path, and may take different forms.

For example, a path metric may be $PM_t = PM_s - \Sigma_i |\beta_t[i] - h(\alpha_v[i])| \times |\alpha_v[i]|$, where $h(\alpha_v[i])$ is a hard decision of an ith element in $\alpha_v$, where i is an integer. For an integer r, $PM_{t_1}, \ldots, PM_{t_r}$ are generated corresponding to r candidate codewords $\beta_{t_1}, \ldots, \beta_{t_r}$ for each list element.

According to an embodiment, the present system and method determines an activation indicator I and a number of candidate paths r on processing a constituent code $(I, r) = f(R, k, m)$, where I is a binary value, $f$ is a function, R is a reliability, k is a number of information nodes, and m is a number of leaf nodes of a constituent code, where R is a number, and k and m are integers. The activation indicator has value 1 (e.g., active) if the constituent code is decoded without traversing the sub-tree and 0 (e.g., inactive) otherwise. Reliability R may take different forms. I and r have an impact on decoding latency reduction/hardware complexity and potential performance degradation, and the function $f$ may characterize the best tradeoff between the two. The present system provides a location-based reliability determination as one realization of the function $f$.

Once the activation indicator I and the number of candidate paths r are determined for an activated node, the present system and method determines the r most probable candidate paths among the potential codewords for each list element. The r potential codewords have the highest reliabilities to generate the candidate paths. The potential codewords of node v are obtained by flipping the binary values of certain combinations of q least reliable bits in $h(\alpha_v[i])$ based on the LLR vector $\alpha_v$ such that it satisfies the constraints imposed by the particular distribution of the k information leaf nodes. In other words, $\beta_{t_j} = (h(\alpha_v[1]), \ldots, h(\alpha_v[m])) \oplus (b_1^j, \ldots, b_m^j)$, where $b_i^j = 0$ for $i \notin \{\min_1, \ldots, \min_q\}$ and $b_i^j \in \{0,1\}$ for $i \in \{\min_1, \ldots, \min_q\}$. $\{\min_j\}$ are the indices of the q least reliable bits with relation $\alpha_v[\min_1] \leq \alpha_v[\min_2] \leq \ldots \leq \alpha_v[\min_q]$. $PM_{t_j}$ (or $PM_{t_j} - PM_s$) may be calculated for each $\beta_{t_j}$, and r candidates with the greatest values for $PM_{t_j}$ (or $PM_{t_j} - PM_s$) are selected.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus for constituent code processing in polar successive cancellation list (SCL) decoding, comprising:
   a processor configured to:
   determine an activation value I and a number r, where I is a binary value and r is an integer, $(I, r) = f(R, k, m)$, $f$ is a function, R is a number indicating node reliability, k is an integer indicating a number of information nodes, and m is an integer indicating a number of leaf nodes;
   determine q indices $\min_1, \min_2, \ldots, \min_q$ of least reliable bits in the constituent code, wherein q is a number;
   determine r candidate paths;
   determine path metrics $PM_{t_j}$ of a codeword j for each candidate path t; and
   select r most probable paths based on $PM_{t_j}$.

2. The apparatus of claim 1, wherein the constituent code is an intermediate node corresponding to a constituent polar code structure called a special node.

3. The apparatus of claim 2, wherein the special node is a single parity check (SPC) code.

4. The apparatus of claim 1, wherein a number of least reliable bits in $h(\alpha_v[i])$ is equal to q, $h(\alpha_v[i])$ is a hard decision of $\alpha_v[i]$, $\alpha_v$ is a vector of length m that indicates log-likelihood ratios of node v, and i and j are integers.

5. The apparatus of claim 2, wherein R is characterized by node location.

6. The apparatus of claim 4, wherein the processor is further configured to determine the q indices $\min_1, \min_2, \ldots, \min_q$ based on $\alpha_v$, wherein $\alpha_v[\min_1] \leq \alpha_v[\min_2] \leq \ldots \leq \alpha_v[\min_q]$.

7. The apparatus of claim 4, wherein the number q is equal to a number of minimum elements found in $|\alpha_v|$, wherein $\alpha_v$ is a vector of length m that indicates log-likelihood ratios of node v.

8. The apparatus of claim 4, wherein the potential codeword j of the node v is obtained by flipping binary values of combinations of q least reliable bits in $h(\alpha_v[i])$ based on $\alpha_v$ such that a constraint imposed by a distribution of the k information nodes is satisfied, wherein $h(\alpha_v[i])$ is a hard decision of $\alpha_v[i]$, $\alpha_v$ is a vector of length m that indicates log-likelihood ratios of node v, and i is an integer.

9. The apparatus of claim 4, wherein each candidate path t is associated with a path metric $PM_t$, wherein $PM_t = PM_s - \Sigma_i |\beta_t[i] - h(\alpha_v[i])| \times |\alpha_v[i]|$, where $PM_s$ is an incoming path metric, $\beta_t$ is a candidate codeword of the node v, and $PM_t$ indicates a reliability of the candidate path t.

10. The apparatus of claim 1, wherein I is determined based on location of a node.

11. A method of constituent code processing for polar successive cancellation list (SCL) decoding, comprising:
   determining an activation value I and a number r, where I is a binary value and r is an integer, $(I, r) = f(R, k, m)$, $f$ is a function, R is a number indicating node reliability, k is an integer indicating a number of information nodes, and m is an integer indicating a number of leaf nodes;
   determining q indicies $\min_1, \min_2, \ldots, \min_q$ of least reliable bits in the constituent code, wherein q is a number;
   determining r candidate paths;
   determining path metrics $PM_{t_j}$ of a codeword j for each candidate path t; and selecting r most probable paths based on $PM_{t_j}$.

12. The method of claim 11, wherein the constituent code is an intermediate node corresponding to a constituent polar code structure called a special node.

13. The method of claim 12, wherein the special node is a single parity check (SPC) code.

14. The method of claim 11, wherein a number of least reliable bits in $h(\alpha_v[i])$ is equal to q, $\{min_j\}$ are indices of the q least reliable bits; $h(\alpha_v[i])$ is a hard decision of $\alpha_v[i]$, $\alpha_v$ is a vector of length m that indicates log-likelihood ratios of node v, and i and j are integers.

15. The method of claim 12, wherein R is characterized by node location.

16. The method of claim 14, wherein determining the q indices $min_1, min_2, \ldots, min_q$ is comprised of determining the q indices $min_1, min_2, \ldots, min_q$ based on $\alpha_v$, wherein $\alpha_v[min_1] \leq \alpha_v[min_2] \leq \ldots \leq \alpha_v[min_q]$.

17. The method of claim 14, wherein the number q is equal to a number of minimum elements found in $|\alpha_v|$, wherein $\alpha_v$ is a vector of length m that indicates log-likelihood ratios of node v.

18. The method of claim 14, wherein the codeword j of node v is obtained by flipping binary values of combinations of q least reliable bits in $h(\alpha_v[i])$ based on $\alpha_v$ such that a constraint imposed by a distribution of the k information nodes is satisfied, wherein $h(\alpha_v[i])$ is a hard decision of $\alpha_v[i]$, $\alpha_v$ is a vector of length m that indicates log-likelihood ratios of node v, and i is an integer.

19. The method of claim 14, wherein each candidate path t is associated with a path metric $PM_t$, wherein $PM_t = PM_s - \Sigma_i |\beta_t[i] - h(\alpha_v[i])| \times |\alpha_v[i]|$, where $PM_s$ is an incoming path metric, $\beta_t$ is a candidate codeword of the node v, and $PM_t$ indicates a reliability of the candidate path t.

20. The method of claim 11, wherein I is determined based on location of a node.

* * * * *